United States Patent [19]

Schülke

[11] Patent Number: 4,569,452

[45] Date of Patent: Feb. 11, 1986

[54] SILICA GLASS TRAY MADE FOR WAFERS

[75] Inventor: Karl-Albert Schülke, Neuberg, Fed. Rep. of Germany

[73] Assignee: Heraeus Quarzschmelze GmbH, Hanau, Fed. Rep. of Germany

[21] Appl. No.: 736,596

[22] Filed: May 21, 1985

[30] Foreign Application Priority Data

May 28, 1984 [DE] Fed. Rep. of Germany ....... 3419866

[51] Int. Cl.⁴ .............................................. B65D 25/28
[52] U.S. Cl. .................................. 206/454; 206/316; 211/41
[58] Field of Search ............... 206/454, 444, 445, 564, 206/316, 309, 0.8; 211/41

[56] References Cited

U.S. PATENT DOCUMENTS

| 1,515,638 | 11/1924 | Wason | 206/316 |
| 2,143,638 | 1/1939 | Weidman | 206/454 |
| 2,337,468 | 12/1943 | Hilger | 206/454 |
| 2,431,535 | 11/1947 | Bergstrom | 206/454 X |
| 3,951,587 | 4/1976 | Alliegro et al. | 206/454 X |
| 4,318,749 | 3/1982 | Mayer | 211/41 X |
| 4,515,104 | 5/1985 | Lee | 211/41 X |

FOREIGN PATENT DOCUMENTS 3024751 3/1982 Fed. Rep. of Germany.

Primary Examiner—Steven M. Pollard
Attorney, Agent, or Firm—Sprung Horn Kramer & Woods

[57] ABSTRACT

A tray made of silica glass or ceramic material with a seating component made out of U-shaped lengths, for disk-shaped elements and especially for round wafers, whereby the elements are secured in the seating component by means of slots. To provide a tray that is shaped in such a way as to provide easy access, is highly stable, and is designed to accept a wide range of wafer sizes, the seating component is in the form of two U sections, each with a base and two sides that are spaced by means of transverse tubes in such a way that the bases of the sections slope toward each other, the slots in the sides being deep enough for the upright elements to rest at points or along lines on the bases.

14 Claims, 1 Drawing Figure

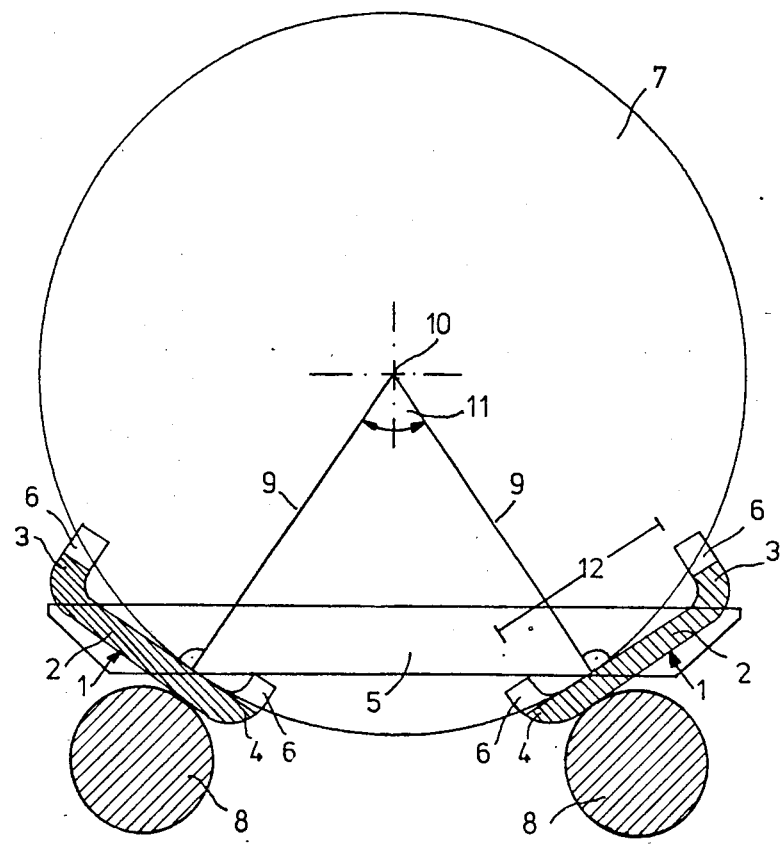

SILICA GLASS TRAY MADE FOR WAFERS

BACKGROUND OF THE INVENTION

1. Field of the Invention

The present invention relates to a tray made of silica glass or ceramic material with seats made out of profiled elongated members provided with slots to serve as seats for disk-shaped elements such as round wafers.

2. Discussion of the Prior Art

A tray of this type is known from Gemeran Pat. No. 3 024 751, which discloses a tub-like seating component made out of lengths of silica-glass section with slots in the base and in the upward-oriented ends of the tub. The slots constitute a three-point support for the wafers inserted in them. The total weight of the wafer rests on the base of the tray when it is fresh from the factory and used for the first time, with the slots at the ends of the tub functioning only to position the wafers. Subject, however, to the weight of the wafers inserted in the tray and to the very high temperatures that the wafers are treated at and which the tray itself is also accordingly subjected to, the tray will deform slightly when used for a long period of time and the substrate itself will come into contact with the ends of the tub, resulting in a three-point support. A tray of this type must be practically constantly supported externally by special supporting frames. Trays of this type are limited both in that the material they are manufactured out of has to be thick enough to obtain the requisite strength and in the tolerances to which that they can be contoured and shaped.

Another tray, made out of rods and called a rod tray, is known from German Utility Model No. 8 021 868. It comprises four slotted silica-glass rods rigidly fused together by means of a silica-glass tube between the upper and lower rods. This type of rod tray has properties that are more desirable than those of any other type in that it consists of only a few parts, and of parts that are also uniform. Still, the freely suspended parts cannot be prevented from buckling once the tray has been used for a while.

The object of the present invention is to provide a tray made of silica glass or ceramic material for disk-shaped elements and especially for round wafers that is shaped in such a way as to provide easy access of process gas and loading/unloading tools, and is highly stable. The design principle allows easy adaptation to different wafer sizes.

SUMMARY OF THE INVENTION

This object is attained in accordance with the invention in that the seating component is in the form of two U sections 1, each with a base 2 and two sides 3 and 4, that are kept separate by means of transverse tubes 5 in such a way that the bases of the sections slope toward each other, whereby the slots 6 in the sides are deep enough for the upright elements to rest at points or along lines on the bases.

The overall load, consisting of the wafers, rests in the sectional tray in accordance with the invention at two points or along lines in the slope between the two U sections. The slots in the sides remain unencumbered and will not deform, aside from the very slight deformation resulting from their inherent weight. The total weight of the elements can be accommodated directly along the line of support, on the bottom of the bases that is, by appropriate frames if necessary. This is a particular advantage. Another is that the tray consists of only a few components, specifically the two U sections and the two transverse tubes. The prefabricated lengths of section can be kept on hand, oriented and positioned in accordance with the dimensions of the particular wafers being processed, and fused to the transverse tubes Since round wafers usually come in a limited range of diameter—100, 125, 150, and 200 mm—it will never be necessary to keep more than two different sizes on hand. A third advantage is that the open structure of the tray makes it easy to load and unload, finally, that the process gas has deliberate access to all parts of the wafers' surface.

It can be an advantage, depending on the shape of the wafers, either to match the contour of the area of the base that comes into contact with the wafers to their outer contour and accordingly allow the wafers to rest along a line or to make the area flat. The latter will allow the wafers to rest at two points if they are round or along a line if they have straight sides.

Since the substrates rest against the base strictly at points or along lines and the slots in the sides are intended only to help position the chips, it will be an advantage if the sides are slotted all the way down to the base. This will adapt the tray to chips with a wider range of diameters while preventing the different wafers, the largest and smallest for instance, to rest in an undesired position in the slots.

The stability of the tray can be increased even more with reinforcements 8 on the bottom of the bases, specifically in the vicinity of the points or lines where the wafers are supported. Such reinforcements will directly accommodate the total mass or weight of the wafers.

It has turned out to be practical for the free space 12 between the sides of the lengths of section to be 10 to 70% as wide as the sides or diameters of the wafers are long, the optimum being about 30%.

In positioning the bases it is practical to ensure that the lines 9 connecting the center 10 of the substrate with the base of the section include a right angle, an angle 11 of between 15° and 150°. More appropriate, however, is an angle of between 60° and 120° and an angle of about 90° is preferred.

Some preferred embodiments of the invention will now be described with reference to the attached drawing.

BRIEF DESCRIPTION OF THE DRAWING

The single FIGURE is a section through a tray in accordance with the invention with a round wafer resting in it.

DETAILED DESCRIPTION OF THE PREFERRED EMBODIMENTS

The tray consists of two U sections 1, each with a base 2, an outer side 3, and an inner side 4. Both sections 1 are kept separate by a transverse tube 5 at each end in such a position that their bases 2 slope toward each other. The sides 3 and 4 in this embodiment have slots 6. The slots 6 in the inner sides 4 extend all the way to base 2, whereas those in the outer sides 3 extend only halfway through the side. Sides 3 and 4 can extend at precisely a right angle to base 2 or can slope slightly outward.

The round wafer 7 inserted in the tray rests against the bases 2 of sections 1 only at two points. Slots 6 only support the wafers at their faces and keep them parallel to one another. Sections 1 slope toward each other at such an angle that lines 9 connecting the center 10 of the substrate to the points where it contacts bases 2 will include an angle 11 of about 70°, with the bases perpendicular to the lines. The free space 12 between the sides 3 and 4 of sections 1 in this embodiment is about 35 mm long. The walls of sections 1 are about 4 mm thick. A tray of these dimensions is very satisfactory for holding round wafers with a diameter of 125 mm. Transverse tubes 5 are silica-glass tubes with beveled ends.

It will be understood that the specification and drawing are illustrative but not limitative of the present invention and that other embodiments within the spirit and scope of the invention will suggest themselves to those skilled in the art.

What is claimed is:

1. A tray made of silica glass or ceramic material and suited for holding a plurality of disk-shaped elements, comprising a pair of spaced U-shaped elongated members each having
a base, a pair of legs and a mouth, and a plurality of transverse tubes connecting the members so that their mouths face a common point, the members being provided along their length with transverse slots extending through their legs to form seats for the elements.

2. A tray according to claim 1, wherein at least the contour of the area of the base that comes into contact with the elements is matched to the outer contour of the elements.

3. A tray according to claim 1, wherein at least the area of the base that comes into contact with the chips is flat.

4. A tray according to claim 1, wherein the legs of each member are slotted all the way down to its base.

5. A tray according to claim 1, including reinforcements in the form of feet or rods on the bottom of each base in the vicinity of the points or surfaces where the elements are supported.

6. A tray according to claim 5, wherein the reinforcements are rigidly fused to the bases.

7. A tray according to claim 5, wherein the reinforcements have a round cross-section.

8. A tray according to claim 5, wherein the members and reinforcements are made of the same material.

9. A tray according to claim 1, wherein the distance between the legs of each U-shaped member is 10 to 70% of the diameter of each element.

10. A tray according to claim 1, wherein the distance between the legs of each U-shaped member is about 30% of the diameter of each element.

11. A tray according to claim 1, wherein the perpendiculars from the common point to the bases of the members subtend an angle of between 15° and 150°.

12. A tray according to claim 11, wherein the angle is between 60° and 120°.

13. A tray according to claim 11, wherein the angle is about 90°.

14. In combination, a tray according to claim 1 and a plurality of wafers in the slots.

* * * * *